(12) United States Patent
Xiao et al.

(10) Patent No.: US 6,756,237 B2
(45) Date of Patent: Jun. 29, 2004

(54) REDUCTION OF NOISE, AND OPTIMIZATION OF MAGNETIC FIELD SENSITIVITY AND ELECTRICAL PROPERTIES IN MAGNETIC TUNNEL JUNCTION DEVICES

(75) Inventors: Gang Xiao, Barrington, RI (US); Xiaoyong Liu, Providence, RI (US)

(73) Assignee: Brown University Research Foundation, Providence, RI (US)

( * ) Notice: Subject to any disclaimer, the term of this patent is extended or adjusted under 35 U.S.C. 154(b) by 0 days.

(21) Appl. No.: 10/105,831

(22) Filed: Mar. 25, 2002

(65) Prior Publication Data

US 2003/0179511 A1 Sep. 25, 2003

(51) Int. Cl.$^7$ .............................................. H01L 21/00
(52) U.S. Cl. .......................................... 438/3; 438/238
(58) Field of Search ........................... 438/3, 238–256, 438/381–399

(56) References Cited

U.S. PATENT DOCUMENTS

| | | | | |
|---|---|---|---|---|
| 5,841,692 A | * | 11/1998 | Gallagher et al. | 365/173 |
| 5,862,022 A | | 1/1999 | Noguchi et al. | 360/113 |
| 6,165,287 A | | 12/2000 | Sato et al. | 148/276 |
| 6,266,218 B1 | | 7/2001 | Carey et al. | 360/324.12 |
| 6,448,766 B1 | | 9/2002 | Berger et al. | 324/244 |
| 6,495,275 B2 | * | 12/2002 | Kamiguchi et al. | 428/692 |

OTHER PUBLICATIONS

S. Ingvarsson et al., "Electronic noise in magnetic tunnel junctions", Journal of Applied Physics, vol. 85, p. 5270, 1999.
S. Ingvarsson et al., "Low frequency magnetic noise in magnetic tunnel junctions", Physical Review Letter, vol. 85, p. 3289, 2000.
E. R. Nowalk, et al., "Noise properties of ferromagnetic tunnel junctions", Journal of Applied Physics, vol. 84, p. 6195, 1998.
D. S. Reed, "Low frequency noise in magnetic tunnel jnctions", IEEE Transactions on Magnetics, vol. 37, p. 2028, 2001.
B.L.T. Plourde et al., "Design of a Scanning Josephson Junction Microscope for Submicron–Resolution Magnetic Imaging", Review of Scientific Instruments. vol. 70, No. 11, pp 4344–4347. Nov. 1999.

* cited by examiner

Primary Examiner—H. Jey Tsai
(74) Attorney, Agent, or Firm—Harrington & Smith, LLP

(57) ABSTRACT

Magnetic tunneling junction devices (MTJ) useful for sensing and memory applications and characterized by reduced resistance, magnetic noise, increased sensitivity, and increased magnetoresistance are disclosed herein. A method for fabrication of said MTJ is also disclosed wherein a series of materials are layered upon a substrate under controlled conditions, patterned and subjected to a period of annealing for simultaneously optimizing a plurality of performance parameters.

35 Claims, 14 Drawing Sheets

REDUCTION OF NOISE, AND OPTIMIZATION OF MAGNETIC FIELD SENSITIVITY AND ELECTRICAL PROPERTIES IN MAGNETIC TUNNEL JUNCTION DEVICES

STATEMENT OF GOVERNMENT RIGHTS

This invention was made with government support under National Science Foundation Award #DMR-0071770. The government has certain rights in this invention.

FIELD OF THE INVENTION

This invention relates to magnetic tunnel junction (MTJ) devices and methods for fabrication of MTJ devices having properties of reduced noise, electrical resistance, increased magnetoresistance, and increased magnetic field sensitivity.

BACKGROUND OF THE INVENTION

The discovery of large magnetoresistance in magnetic tunnel junction devices (MTJs) at room temperature has renewed intensive interest in this type of device. In part, this interest is due to the potential applications in sensitive magnetic sensors and in non-volatile magnetic random access memory (MRAM). The key component in an MTJ device is a sandwich structure (metal/insulator/metal) consisting of two ferromagnetic (FM) metallic layers (top and bottom electrodes) separated by a thin insulating barrier. The barrier is thin enough to allow quantum mechanic tunneling to occur between two ferromagnetic layers. The tunneling resistance of MTJ device depends on the relative orientation of the magnetization vectors (M) in the two FM layers. The magneto-tunneling effect exploits the asymmetry in the density of states of the majority and minority energy bands in a ferromagnet. The larger the asymmetry the larger the spin polarization is, and so the larger the magneto-tunneling effect.

When subject to an external magnetic field, an MTJ device suffers a change in its electrical resistance. The relative resistance change is called magnetoresistance (MR) or the MR ratio, defined as:

$$\frac{\Delta R}{R} = \frac{R(H) - R_S}{R_S} \quad (1)$$

where $R(H)$ and $R_s$ are resistance values, at a measurement magnetic field H, and at saturation field, respectively. Beyond the saturation field, resistance remains at a constant value of $R_s$. The property of MR as defined in relation (1) has been used to sense magnetic field by measuring resistance change in a field. In general, a good magnetoresistive sensor is characterized by a large MR value achieved at a small saturation field. To obtain a large MR ratio, the quality of the tunnel barrier is critically important. The thin insulating barrier should be smooth, pin-hole free, well oxidized, and of proper stoichiometry.

In MTJ devices, when the M vectors are parallel in the two FM electrodes, there is a maximum match between the numbers of occupied electron states in one electrode and available states in the other. The electron tunneling current is at maximum and the tunneling resistance (R) minimum. On the other hand, in the antiparallel configuration, the electron tunneling is between the majority electron states in one electrode and minority states in the other. This mismatch results in a minimum current and a maximum resistance. In a typical MTJ sensor, the M vector of one FM electrode is pinned by an adjacent antiferromagnetic layer via so called "exchange bias" coupling effect. The M vector of the other FM electrode is free to rotate. Since an external field can easily alter the direction of this M vector, the tunneling resistance is sensitive to the field to be measured. According to Julliere's magnetotunneling model, "Tunneling between ferromagnetic films", Physics Letters, vol. 54A, No.3 (1975), pp.225–226, the maximum MR ratio between parallel and antiparallel configurations is $$\frac{\Delta R}{R} = \frac{R_{\uparrow\downarrow} - R_{\uparrow\uparrow}}{R_{\uparrow\uparrow}} = \frac{2P_1 P_2}{1 - P_1 P_2}, \quad (2)$$

where $P_1$ and $P_2$ are the spin-polarization factors of the two electrodes. For a transition ferromagnetic metal (Co, Fe, Ni, and their alloys), P is in the range of 20–40%, leading to $\Delta R/R \sim 8$–38%. For half-metals with a full spin polarization (P~100%), the MR ratio can theoretically approach infinity, which is the characteristic of a perfect spin valve.

MTJs offer a set of major advantages as spintronic devices over other magnetic devices such as devices based on anisotropic magnetoresistance (AMR) and giant magnetoresistance (GMR). Some of the advantages include, but are not limited to, the following.

The junction resistance (R) of an MTJ can be varied easily over a wide range ($10^{-2}$–$10^8$ Ω), while keeping the large MR ratio intact. The value of R depends on barrier thickness (t~0.5–2 nm) exponentially and on junction area (A) inversely. The ability to tailor R in MTJ to suit electronics surpasses that in GMR devices.

MTJ can be miniaturized to nanometer size while retaining an adequate resistance, because R is primarily sensitive to barrier thickness. This property, not available in GMR spin-valves, is particularly important for high-resolution field imaging.

MTJ devices can operate in a very large frequency range (0–5 GHz) with good response.

MTJ devices are simple two-terminal resistive devices, requiring only small current density to operate. The stray field generated by the sensing current is small.

MTJ devices have a larger MR ratio. For example, a MR value as high as 49.7% at room temperature has been reported in MTJs with electrodes composed of $Co_{75}Fe_{25}$, an alloy with a high spin polarization. In contrast, a commercial (Fe—Ni)/Cu/Co GMR sensor has a maximum MR of 9%.

One other major advantage of MTJ devices is that the magnetic coupling between the sensing layer and the pinned layer is weak because of the absence of RKKY magnetic interaction that is found in GMR sensors.

When characterizing an MR sensor, many researchers would use the MR ratio as a figure of merit. However, for field-sensing applications, a large MR ratio alone is insufficient. It is the intrinsic noise figure, both magnetic and electric, that determines the ultimate sensor performance. While reductions in noise are critical, and external noise reductions are relatively simple to achieve, control of a sensor's internal noise is more difficult. Failure to adequately reduce the sensor's internal noise could impede or swamp detection of small field modulations, regardless of the MR ratio. The field-sensing ability of the MTJ can be complicated by many internal noise sources: Johnson-Nyquiist (limited by resistance and temperature), tunneling current (shot noise), 1/f (two-level systems from defects), Barkhausen (domain-wall movement), and thermal fluctuations in magnetization. For typical sensing and memory applications, it is paramount that the magnetic and electric noise of an MTJ device be reduced as much as possible.

Prior to the present invention disclosed herein, there has been no effort to develop fabrication and post-deposition processes to reduce the noise in MTJ devices. S. Ingvarsson et al., measured the electric and magnetic noise in non-optimized MTJ memory devices but did not include sensor devices. Results were presented in "Electronic noise in magnetic tunnel junctions", *Journal of Applied Physics*, vol. 85, page 5270 (1999) and in "Low frequency magnetic noise in magnetic tunneling junctions", *Physical Review Letter*, vol. 85, page 3289 (2000). E. R. Nowak, et al., measured the electronic noise in non-optimized MTJ memory (not sensor) devices, but did not evaluate the magnetic noise, as presented in "Noise properties of ferromagnetic tunnel junctions", *Journal of Applied Physics*, vol. 84, page 6195 (1998) and in "Electric noise in hysteretic ferromagnet-insulator-ferromagnet tunnel junctions" *Applied Physics Letter* vol. 74, page 600 (1999). In another electronic noise study, it was claimed that no magnetic noise was observed in the MTJ samples. This study was published by Daniel S. Reed in NVE, in "Low Frequency Noise in magnetic Tunnel Junctions", *IEEE Transactions on Magnetics*, vol. 37, page 2028(2001). However, this invention shows that magnetic noise definitely exists in MTJ devices, and represents the dominant source of noise.

Even though MTJ devices have larger MR ratios than AMR or GMR devices, no effort has been made so far to reduce the intrinsic noise of MTJ devices. However, in both sensing and memory applications, low noise levels are a requirement. Various improvements in sensing and memory applications are thus contingent upon the development of improved sensing devices.

SUMMARY OF THE INVENTION

The foregoing and other problems are addressed and solved by the teachings in accordance with this invention.

Disclosed herein are low noise, low resistance, high sensitivity, and large magnetoresistance magnetic tunnel junction (MTJ) devices, and methods for fabricating these devices.

The devices produced by the method disclosed herein offer significant improvements in magnetoresistance, resistance, field sensitivity, and noise level over existing devices, as confirmed by structural, magnetic, and transport characterizations. For example, observations have revealed these devices are capable of antiferromagnetic/ferromagnetic interfacial exchange bias fields of 420 Oe and magnetoresistance of up to 38.0%. Linear and non-hysteretic field sensing response has been achieved by providing a moderate hard-axis bias field. Under optimal thermal annealing, intrinsic magnetic noise was reduced to only 1 $nT/Hz^{1/2}$, which is about 0.0002 of the earth's magnetic field. Simultaneously, the magnetoresistance and sensitivity are highest at 35% and 5%/Oe.

The MTJ devices are fabricated through a multi-step process. In this process, a series of seven layers are deposited upon a substrate. In a preferred embodiment, the substrate is formed of silicon, and the surface is prepared with thermally oxidized $SiO_2$. Once the substrate has been prepared, the layers are sequentially deposited with the first application being called the buffer layer. Subsequent to the buffer layer, a seed layer is applied, followed by an antiferromagnetic (AFM) layer, a pinned layer, a barrier layer, a free layer, and last of all a passivation layer.

In the preferred embodiment, the layers are deposited sequentially in the order of a thickness of about 30 nm of Pt (as the buffer layer), a thickness of about 3 nm of $Ni_{81}Fe_{19}$ (seed layer), a thickness of about 13 nm of $Fe_{50}Mn_{50}$ (AFM layer), a thickness of about 6 nm of $Ni_{81}Fe_{19}$ (pinned layer), a thickness of about 0.5–2 nm of $Al_2O_3$ (barrier layer), a thickness of about 12 nm of $Ni_{81}Fe_{19}$ (free layer), and a thickness of about 49 nm of Al (passivation layer). These thicknesses, or materials, however, should not be interpreted as limitations upon the practice of this invention.

In the preferred embodiment, the layers are deposited through a process of sputtering with a DC magnetron in a reduced pressure environment while a magnetic field is applied to induce uniaxial anisotropy in the ferromagnetic layers. Deposition occurs at room temperature. The $Al_2O_3$ layer is formed by oxidizing a thin layer of Al at an increased pressure for a specific period of time. Once the $Al_2O_3$ has been deposited, the pressure is again reduced and the residual oxygen gas is substantially removed from the fabrication area. These steps occur prior to the deposition of the $Ni_{81}Fe_{19}$ in the free layer. Once the $Ni_{81}Fe_{19}$ has been sputtered over the $Al_2O_3$ layer, an Al passivation layer is deposited to protect the structure from oxidation.

After the process of depositing the layers on the silicon wafer has been completed, the structure is divided into a plurality of appropriately sized segments. In the preferred embodiment, lithography techniques are used to divide the structure into segments appropriately sized for use as MTJ devices. Electrical contacts may conveniently be implanted into the segments during this step of fabrication.

Finally, the segments are annealed under conditions that have been set to optimize the performance of important properties of the MTJ. For instance, optimal temperature for annealing is determined through correlating the MTJ device performance to results from a series of annealings completed at varied temperatures. In this manner, selection of optimal annealing conditions for maximizing performance of an MTJ device is determined.

In the preferred embodiment, the MTJ devices are annealed for approximately ten minutes at a temperature of approximately 168° C to 170° C.

BRIEF DESCRIPTION OF THE DRAWINGS

FIG. 4A shows the magnetic hysteresis loops of an as-deposited (open circles) and a post-pinned (solid circles) MTJ device. The two sub-loops correspond to the magnetic switchings of the free and pinned layers.

FIG. 4B shows an X-ray diffraction pattern of an as-deposited (open circles) and a post-pinned (solid circles) MTJ device.

DETAILED DESCRIPTION OF THE PREFERRED EMBODIMENTS

Figure 1B:
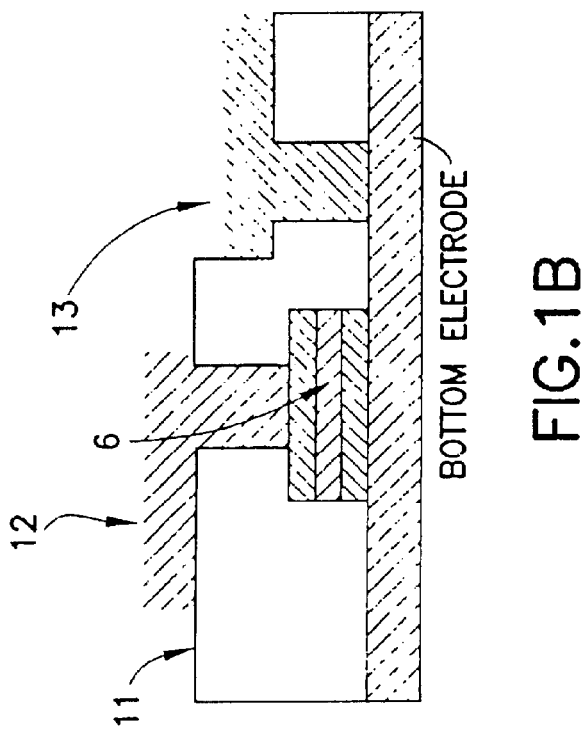
FIG. 1B is schematic view of a lithographically patterned MTJ sensor device.

Disclosed herein are magnetic tunneling junction devices (MTJ), and a method for fabrication of MTJ devices, wherein these devices are characterized by, among other things, reduced internal noise, reduced electrical resistance, increased magnetoresistance, and magnetic field sensitivity relative to other devices, such as anisotropic magnetoresistance (AMR) and giant magnetoresistance (GMR) devices.

Magnetic tunnel junction devices (MTJ) were constructed in accordance with the teachings of the preferred embodiment disclosed herein. Aspects of the MTJ so constructed are illustrated in the drawings, and described below. Those skilled in the art will recognize that other embodiments may be realized through these teachings.

Although the embodiment disclosed herein was used to produce experimental structures, it is illustrative of this invention for fabrication of improved MTJ devices, and should not be considered limiting of the invention. One skilled in the art will recognize that variations from the described embodiment may be realized in order to produce improved MTJ devices functionally similar to those described herein, and that such variations are within the teachings of this invention.

Figure 1A:
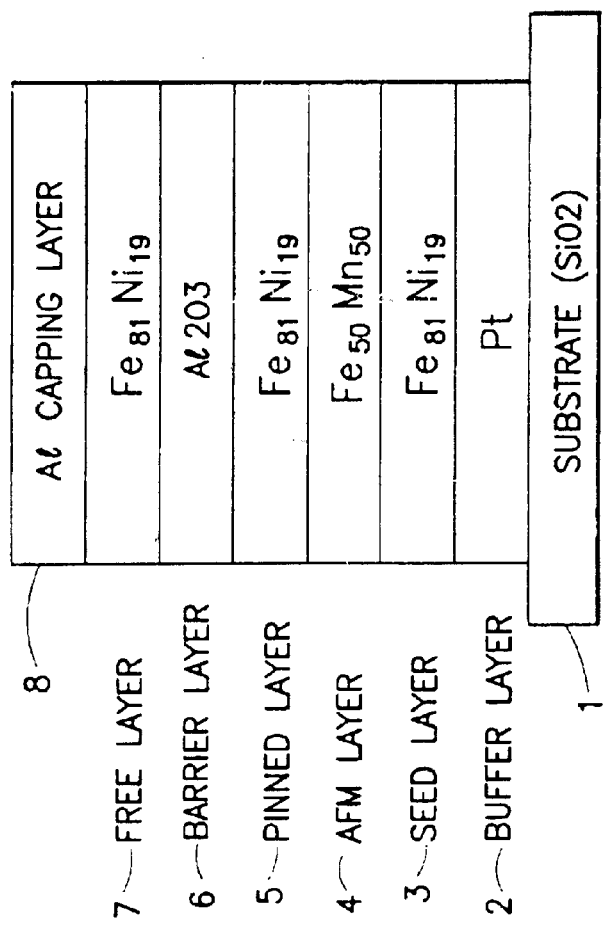
FIG. 1A is schematic diagram of an MTJ layer structure.

A representative MTJ structure is shown in FIG. 1A. The structure is formed of a stack of seven layers, deposited sequentially upon a substrate 1. The first layer being called the buffer layer 2. A seed layer 3 is then applied, followed by an antiferromagnetic (AFM) layer 4, a pinned layer 5, a barrier layer 6, a free layer 7, and, last of all, a passivation layer 8.

In the preferred embodiment, the substrate 1 was a Si(100) wafer with a surface having thermally oxidized $SiO_2$ disposed thereon. Subsequently, the layers were sequentially deposited on the Si(100) substrate 1 at room temperature. The layers were applied by DC magnetron sputtering (base pressure $2\times10^{-8}$ Torr) with 5 mTorr of Argon pressure during sputtering. The sputtering rate of each layer was calibrated by low angle X-ray diffraction and Dektek depth profilometer, and the typical sputtering rate was 0.1–0.2 nm/sec. All layered structures were deposited in one continuous process without breaking vacuum. During deposition, a magnetic field of 120 Oe was applied in plane to induce a uniaxial anisotropy in the ferromagnetic layers.

In the preferred embodiment, the layers were deposited sequentially as a 30 nm thickness of Pt (as the buffer layer 2), a 3 nm thickness of $Ni_{81}Fe_{19}$ (seed layer 3), a 13 nm thickness of $Fe_{50}Mn_{50}$ (AFM layer 4), 6 nm thickness of $Ni_{81}Fe_{19}$ (pinned layer 5), a 0.5–2 nm thickness of $Al_2O_3$ (barrier layer 6), a 12 nm thickness of $Ni_{81}Fe_{19}$ (free layer 6), and a 49 nm thickness of Al (passivation layer 8). These layers were applied at room temperature.

In this embodiment, the buffer layer 2 and seed layer 3 were chosen as a template to promote the <111> crystal texture growth of the antiferromagnetic (AFM) layer 4.

The AFM layer 4 provides a magnetic exchange bias to pin the magnetization of the pinned layer 5 such that only the magnetization of the top FM or free layer 7 can respond to an external sensing field. The FM layer 7 is also called the free layer 7 because its magnetization vector is free to rotate under the influence of an external magnetic field.

In this embodiment, the barrier layer 6 was produced by oxidizing a thin layer of Al in RF (radio-frequency) oxygen glow discharge at 120 mTorr for 80 sec. During oxidation, the Al layer 6 expands its volume by about 30%, which tends to fill the voids or pin-holes in the original Al thin film. Immediately after oxidation, a sputtering gun loaded with a Ti target (away from the deposited sample) was turned on to absorb the residual oxygen gas in the vacuum chamber. The process ensured that the subsequent deposition of the free layer 7 was free of oxidation, as the quality of the $Ni_{81}Fe_{19}$ film is very sensitive to the presence of oxygen. The passivation layer 8 was applied to protect the whole structure against oxidation.

After layering was completed, a standard photolithography technique was used to pattern the bulk MTJ structures into micron scale structures for completion as MTJ devices.

Both Ar ion beam etching and $CF_4$ reactive ion etching (RIE) patterning were used, however, other methods for patterning may be used. FIG. 1B shows a cross-sectional view of a lithographically patterned MTJ device.

In the preferred embodiment, the patterning of the micron scale MTJ devices started with defining the junction area using photolithography and Ar ion beam etching. After stripping the photoresist, the entire wafer was covered by a thick layer of $SiO_2$ 11, having a typical thickness of 200 nm, by either RF sputtering or chemical vapor deposition. Then, windows to the top electrodes were defined using photolithography and RIE. Finally, another lithography step was used and a thick layer of Al or Au was deposited and then "lifted off" to define the top electrical contact pad 12 and the bottom electrical contact pad 13, as shown in FIG. 1B. The junction sizes ranged from microns to about 0.1 mm.

Finally, the MTJ devices were annealed in a field of 1.6 kOe along the easy axis of the pinned FM layer 7 after patterning in order to establish a large AFM/FM exchange bias. In this embodiment, the post-annealing temperature was set at 168° C., unless noted elsewhere. This step is referred to herein as the post-pinning process. As will be discussed in further detail below, this annealing step is an important aspect of the invention.

In another embodiment, the antiferromagnetic material used in the AFM layer 4 is IrMn, which is characterized by a Neel temperature of about 220° C. In a further embodiment, the AFM layer is formed of PtMn, and is characterized by a Neel temperature of about 280° C. The anneal temperature for each of these alternate embodiments will exceed the Neel temperature, and will be set so as to optimize performance parameters of the MTJ device, as described in further detail below.

A comparison of the properties of the MTJ structure before and after post-pinning is now provided.

Figure 2A:
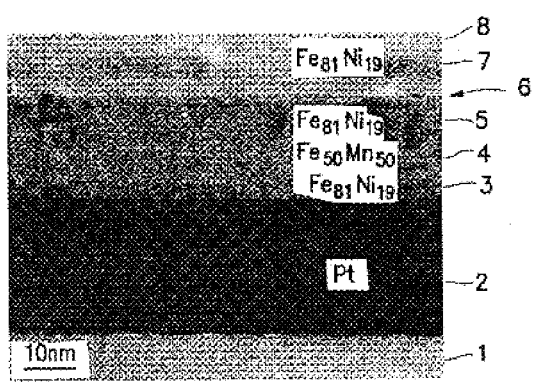
FIGS. 2A–2B, collectively referred to herein as FIG. 2, show cross-sectional transmission-electron-microscopy images of MTJ layer structures for an as-deposited sample (A) and a sample annealed at 168° C. in external field of 1.6 KOe (B).
Figure 2B:
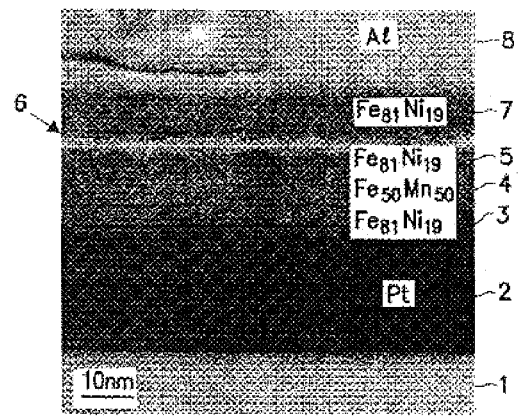

Before patterning, the microstructures of the MTJ layers were examined by cross-sectional imaging using transmission electron microscopy (TEM). FIG. 2 illustrates the interfacial structure of junctions of two MTJ samples, as-deposited and post-pinned. The annealed sample (FIG. 2B) has smoother interfaces between the layers than the as-deposited sample (FIG. 2A). No pinholes or impurities are observed around the barrier layer 6, and there is no evidence of inter-layer diffusion. FIG. 2B also shows a marked improvement in the smoothness of the $SiO_2$ layer 1 after thermal annealing. The quality of the layered structure is, in part, a result of the flatness of the $SiO_2$ layer 1 after thermal annealing.

Figure 3:
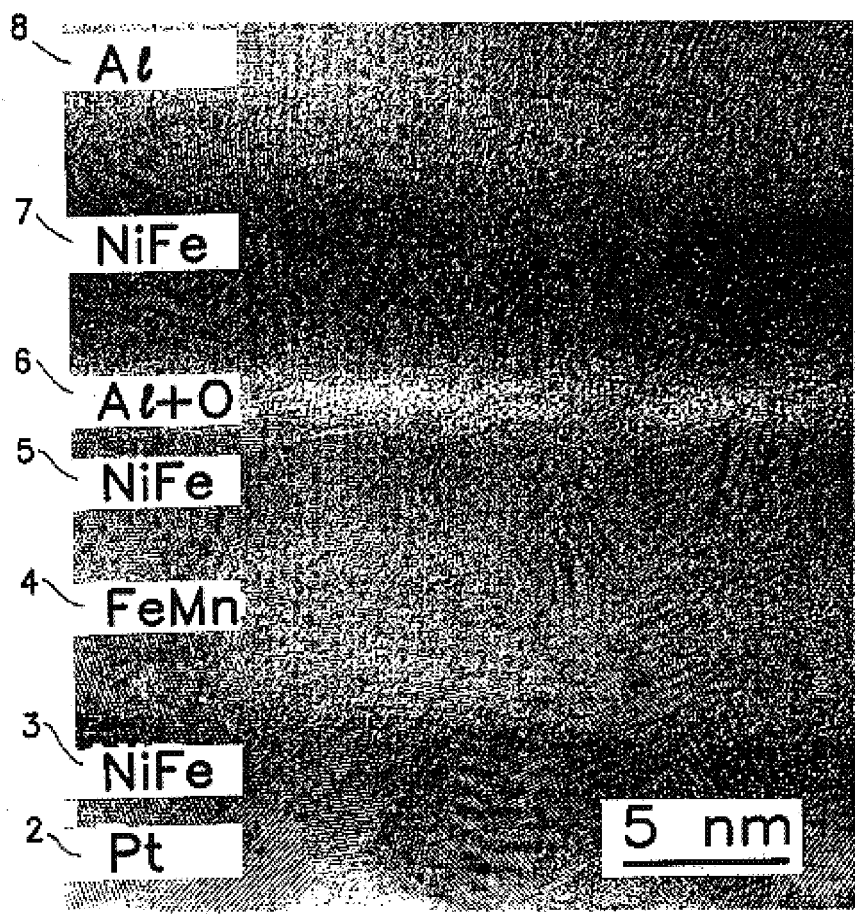
FIG. 3 shows a high-resolution transmission-electron-microscopy image for a post-pinned MTJ structure.

FIG. 3 shows a high-resolution cross-sectional TEM lattice image obtained on an MTJ sample after post-pinning. FIG. 3 reveals polycrystallinity of each layer, except the barrier layer 6, which is amorphous in structure with little or no crystallinity. The derise, homogeneous, isotropic and random arrangement of the atoms in this layer are salient features produced by the post-pinning process, and provide for the improved characteristics of the MTJ devices of this invention.

A careful inspection shows that the barrier layer 6 has a wavy roughness at the $Ni_{81}Fe_{19}/Al_2O_3$ interfaces with the pinned layer 5 and the free layer 7, with a roughness amplitude of 0.3–0.4 nm and a wavelength of about 7 nm. The wavy roughness gives rise to the so-called "orange peel" Neel coupling field of 6.8 Oe.

Figure 4A:
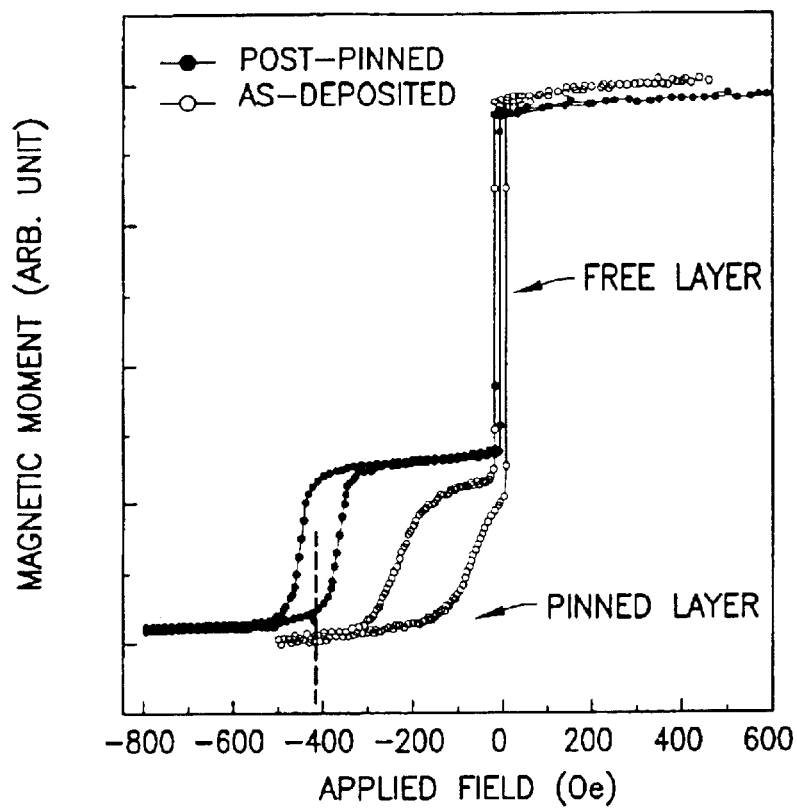
FIGS. 4A–4B, collectively referred to herein as FIG. 4, show as-deposited and post-pinned characteristics of the MTJ device.
Figure 4B:
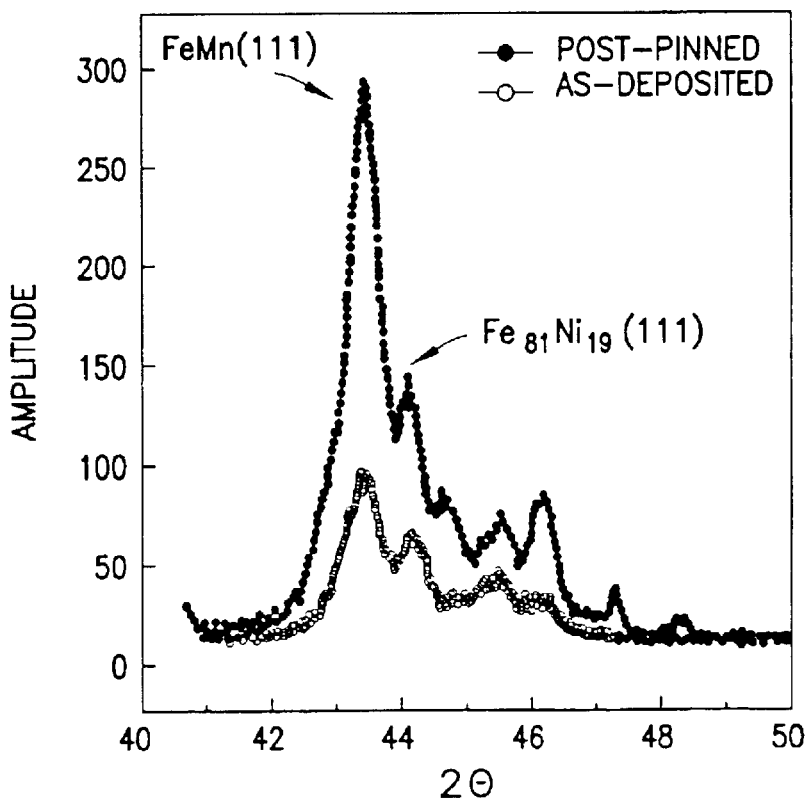

The magnetic properties of the MTJ multilayers were measured by a vibrating sample magnetometer. FIG. 4 shows some representative magnetic hysteresis loops. Exchange bias fields $H_e$ as high as 420 Oe were consistently observed in samples after post-pinning, as compared with 50–200 Oe in as-deposited samples, as shown in FIG. 4A. A long plateau can be seen between the two sub-hysteresis loops for the post-pinned sample, indicating the quality of the anti-parallel alignment of the free 7 and pinned 5 layers. The value of $H_e$ (~420 Oe) after the post-pinning process is superlative for a FeNi/FeMn bilayer structure, thus providing stability against field excursions. It is well known that $H_e$ is inversely proportional to the thickness of the free layer 7 for a given AFM layer 4. From these results, the exchange coupling constant has been calculated as ~0.25 erg/cm$^2$ for the post-pinned samples. Exchange bias fields were further explored via x-ray diffraction, and the results are presented in FIG. 4B. This figure shows a strong and distinct FeMn <111> peak is developed, after post-pinning, in the x-ray diffraction spectrum, indicating a significant <111> texture improvement.

An examination of the magnetoresistance of MTJs at zero biasing fields is now provided.

The patterned junctions were measured on a four-probe station equipped with variable DC magnetic fields of up to 80 Oe along the easy axis of the sample. Results shown in FIG. 4A reveal that the high exchange bias field (~420 Oe) ensures the stability of bottom FM layer and therefore, only the switching behavior of top free layer 7 will be affected by a magnetic field during use. The typical DC bias across the junction is about 10 mV. The lead resistance is much less than the junction resistance, thus eliminating possible anomalous current distribution effects.

Figure 5A:
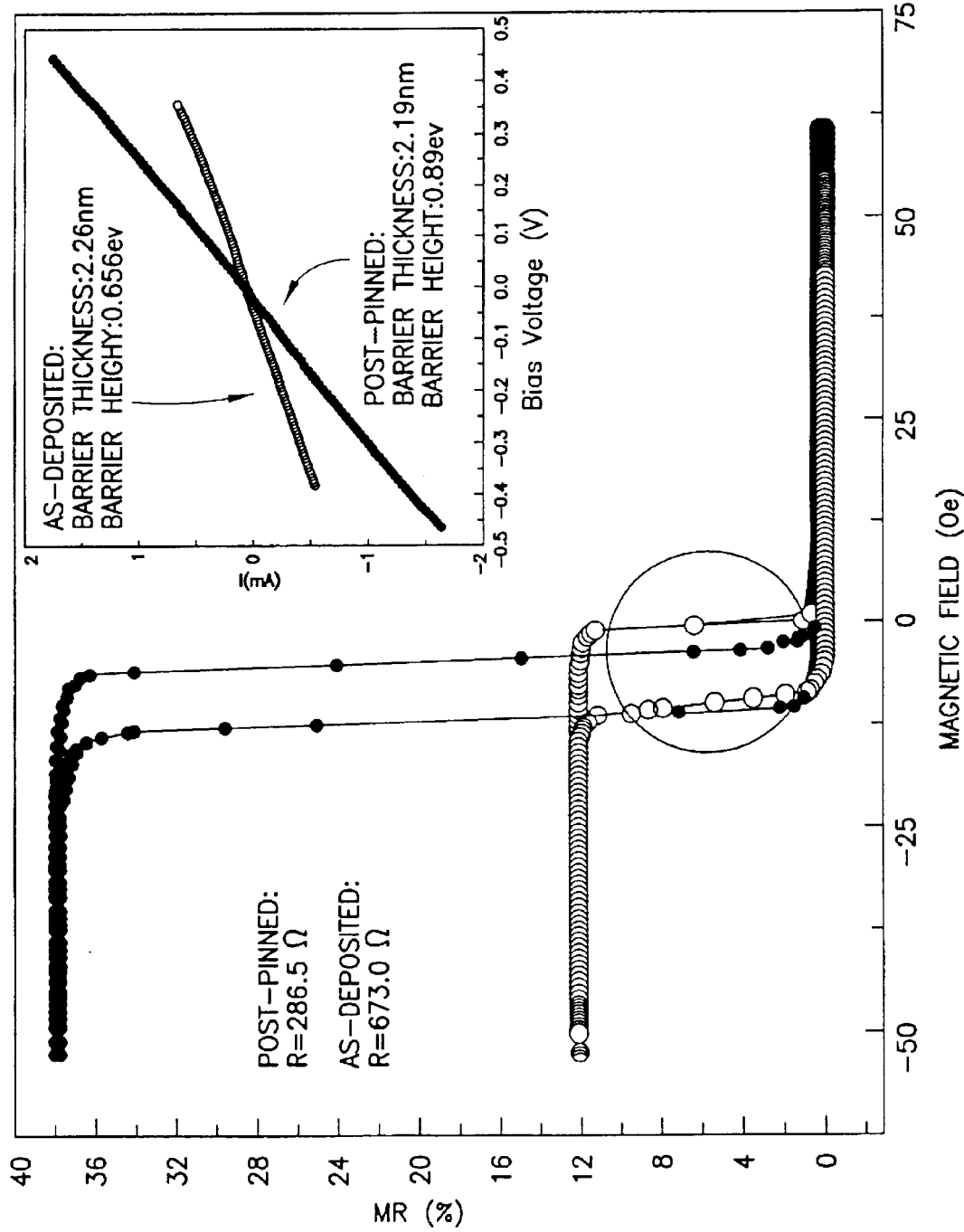
FIG. 5A shows the magnetoresistance curves of an MTJ device with Al thickness of 2 nm and junction area of 150×100 $\mu m^2$. The DC voltage bias is 10 mV. Only the switching of the free electrode is displayed in this field range. Inset: current-voltage curve of same junction.

FIG. 5A shows magnetoresistance response characteristics from representative MTJ devices with size of 150×100 $\mu m^2$. A maximum MR value of 38% was achieved for this size junction after post-pinning, much larger than that of the as-deposited sample, whose MR was only 12.8%. Measured MR ratios at least doubled after post-pinning in every junction examined. Sousa et al, have demonstrated the effect of improvement in MR by thermal annealing in "Large tunneling magnetoresistance enhancement by thermal anneal", Appl.Phys.Lett.73, 3288 (1998). However, the results of Sousa et al. identified that enhancement in MR is typically on the order of 10–65%, much less pronounced than the results disclosed herein.

The current and voltage characteristics of the same sample were measured in the parallel state as shown by the inset of FIG. 5A. After post-pinning, the effective barrier layer 6 thickness dropped from 22.6 Å to 21.9 Å, while the barrier height increased from 0.66 eV to 0.89 eV, according to results of fitting to the Simmons theory (as published in "Generalized formula for the electric tunnel effect between similar electrodes separated by a thin insulating film", J. App. Phys, 34, 1793(1963)).

Other post-pinning effects can also be observed in FIG. 5A. The coercivity for the post-pinned sample is about 3 Oe, smaller than that (5 Oe) of the as-deposited sample. This decrease may be attributed to the reduction in defects as a result of post-pinning. Smaller coercivity is beneficial for an MRAM application as reductions in the effective writing current and, therefore, the power consumption are realized.

Figure 5B:
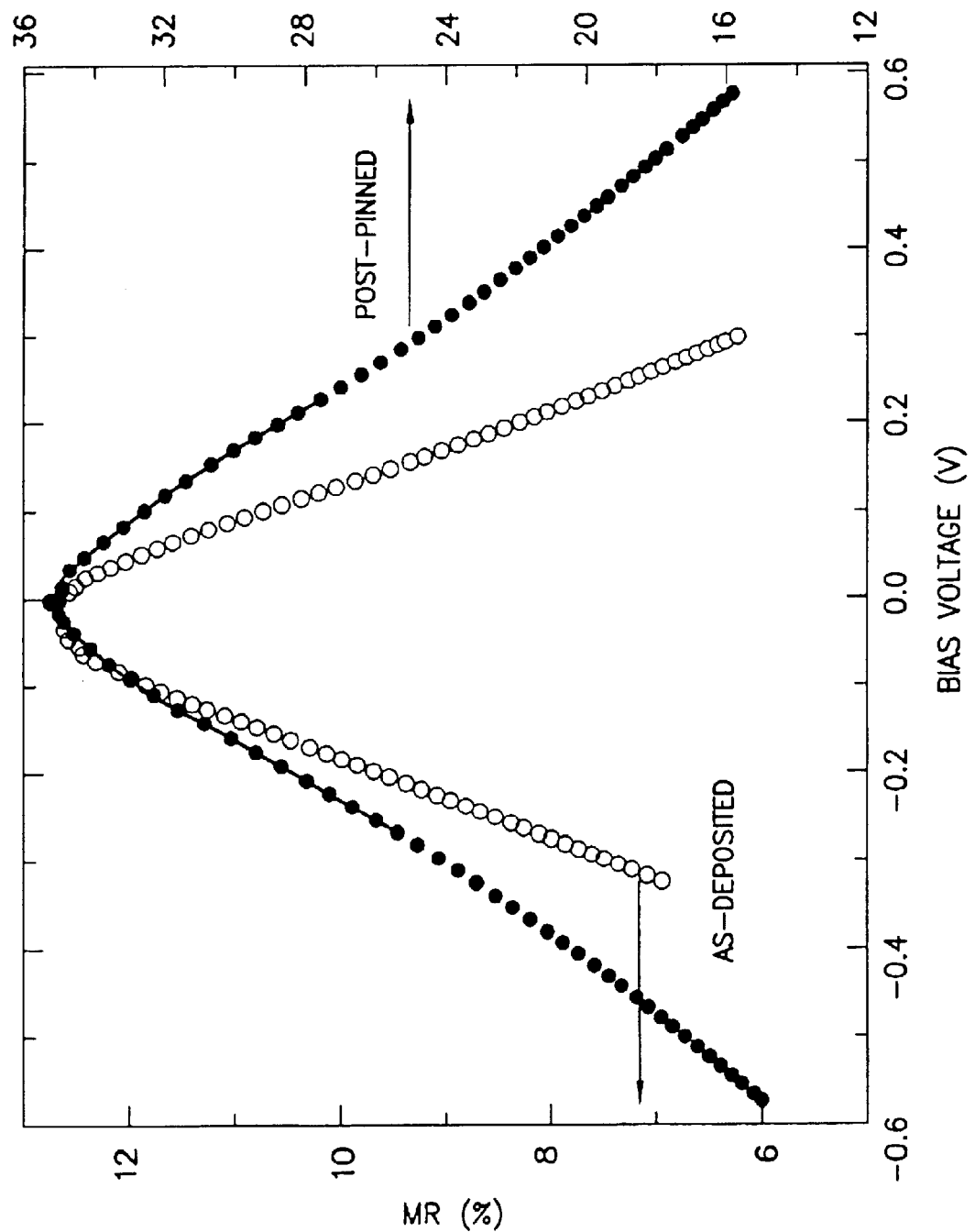
FIG. 5B shows the bias dependence of the same junction in FIG. 5.

FIG. 5B shows the bias dependence of the MR ratio for the same junction. The MR of the as-deposited sample falls off more rapidly at higher bias. The bias voltage at which the MR decreases to half of its maximum value is 550 mV for the post-pinned junction, as compared to 300 mV for the as-deposited sample. This indicates that post-pinning greatly improves junction stability and makes the MR value less dependent on voltage bias. For as-deposited junctions, the pinned layer 5 hysteresis loop is not fully separated from the free layer 7, as seen in FIG. 4A, which suggests the existence of substantial dispersion of magnetization in the pinned electrode. However, after post-pinning the increased AFM/FM exchange bias creates more uniform anti-parallel alignment between the two electrodes 12, 13. In addition, oxygen atoms tend to diffuse more uniformly during pinning, repairing pinholes in the barrier layer 6. These factors lead to a larger MR and narrower MR loop, when compared with the as-deposited samples.

As shown in FIG. 5B, the bias-dependence curve is not symmetric at zero bias for the as-deposited sample, rather the peak position is shifted slightly toward negative bias. According to Simmons' theory, the potential barrier should be symmetric for Py/Al$_2$O$_3$/Py structures; the asymmetric shape is caused by imperfections in the tunnel barrier 6. For example, local spin flip scattering in the barrier 6 could cause this asymmetry. It is believed, that post-pinning repairs these defects, as shown in the bias-dependence curve of FIG. 5B for the post-pinned sample, which shows bias is symmetric about zero.

An examination of MTJ sensor performance under external hard-axis biasing field is now provided.

Figure 6:
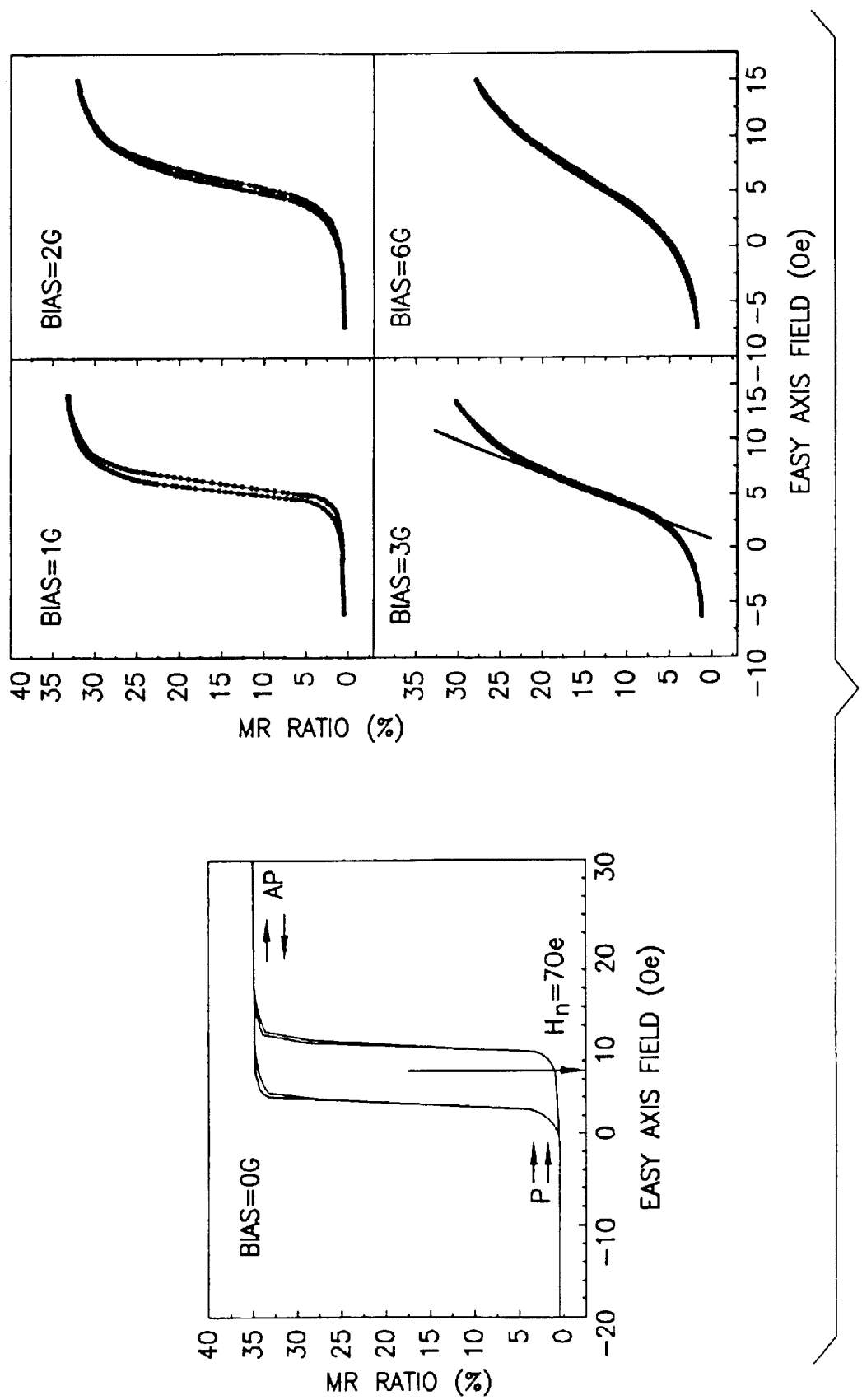
FIG. 6 shows the magnetoresistance loops of an MTJ device under different magnetic bias fields at 0, 1, 2, 3, and 6 Oe, respectively, along the hard axis.

An external bias field was applied perpendicular to the easy axis to stabilize magnetic domain and promote coherent rotation of the magnetization vector in order to realize sensor configuration. The shape anisotropy and demagnetization field were negligible in the junctions examined (on the order of 150×100 $\mu m^2$) due to relatively large junction sizes and small aspect ratios. As a result, the easy axis was set by the applied field direction during the deposition process. FIG. 6 shows representative results with different bias fields. With zero hard-axis fields, the MR curve is square with coercivity H$_c$ of ~3 Oe, and the magnetic response is totally governed by domain wall motion, which is irreversible and hence highly hysteretic. When a hard-axis field is applied, the magnetoresistive response becomes more complicated, with the switching occurring through a combination of discontinuous jumps and coherent magnetization rotation, leading to decreased coercivity and a canting of the MR curve. As the bias field increases, single-domain-like rotation becomes more significant and hysteresis decreases. For bias fields greater than 3 Oe, magnetization rotation starts to dominate, and magnetic switching is coherent and reversible, with little or no hysteresis. Hence, the MR is linear within a small field range. The slope, which determines the sensitivity of the sensor, is at a maximum (~5%/Oe) in this bias field (3 Oe), and decreases slowly with increasing bias field.

Figure 7:
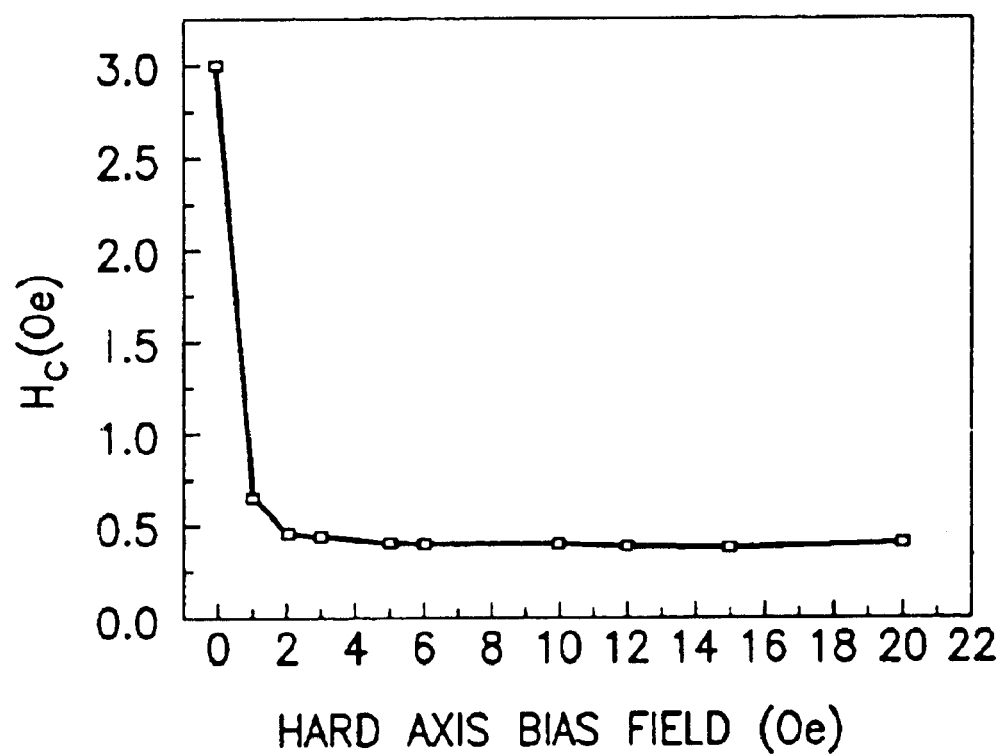
FIG. 7 shows the dependence of the coercivity, $H_c$, of an MTJ device (in FIG. 6) on hard-axis bias field with easy field sweeping in the range of +18 Oe to −10 Oe. $H_c$ drops to a minimum value of 0.4 Oe once the hard-axis field is larger than 3 Oe.

FIG. 7 shows the dependence of coercivity, H$_c$, on hard axis bias field. H$_c$ is very sensitive to small hard-axis fields. H$_c$ drops abruptly from 3 Oe to less than 1 Oe upon introduction of a bias field, then decreases slowly as the bias field increases further. Coercivity reaches a minimum of ~0.4 Oe when the bias field is 3 Oe, and maintains this value, with minor fluctuations (±0.1 Oe), at higher bias fields. Study showed that coercivity further decreases with decreasing sweeping field range along the easy axis without loss of sensitivity.

An evaluation of low frequency noise in MTJs is now provided.

The field dependence of low frequency noise in MTJ sensors was measured in a magnetically shielded box. Using a battery to provide voltage bias, the voltage fluctuations across the junction were amplified via a commercial low-noise preamplifier, anti-alias filtered and then fed into a low frequency spectrum analyzer to obtain the power spectral density. A typical frequency range of measurement is 1–400 Hz. A cross-correlation method was employed to extract the low sensor noise from unwanted background and system noises. Low DC sense current was used to avoid any interference from fields created by sense currents or possible current-induced noise in the MTJs. During the measurement, the magnetic field was slowly stepped in 1–2 Oe increments along the easy axis. At each step, after allowing the sample to equilibrate for 2 minutes, simultaneous measurements of time-series voltage fluctuations and noise spectrum S$_V$(f) were taken. Due to the history dependence of the ferromagnetic materials in MTJs, the field was swept back and forth several times before actual data was collected.

Figure 8:
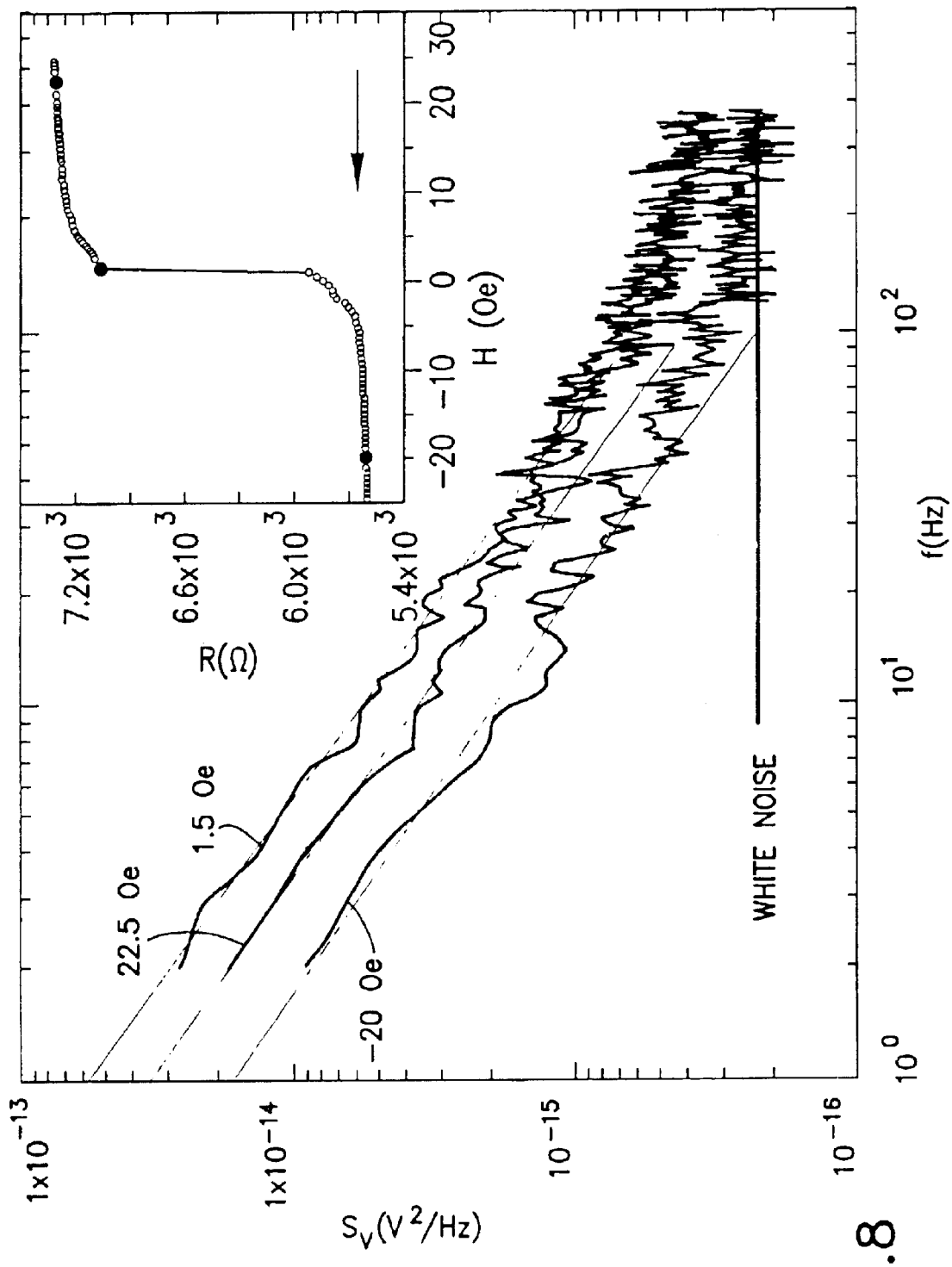
FIG. 8. shows the voltage noise frequency spectra obtained from an MTJ device with a junction area of 16×32 $\mu m^2$ under three different easy-axis fields. The flat reference line at the bottom is the white noise, or Johnson thermal noise ($S_V$=4 $k_B$TR) calculated from the resistance of the junction. The dashed lines represent the low frequency 1/f noise, which describe the noise data well. The inset is a portion of the magnetoresistance curve. The noise spectra and the resistance are measured simultaneously. The three marked dots on the curve are where the noise spectra were measured sequentially.
Figure 9A:
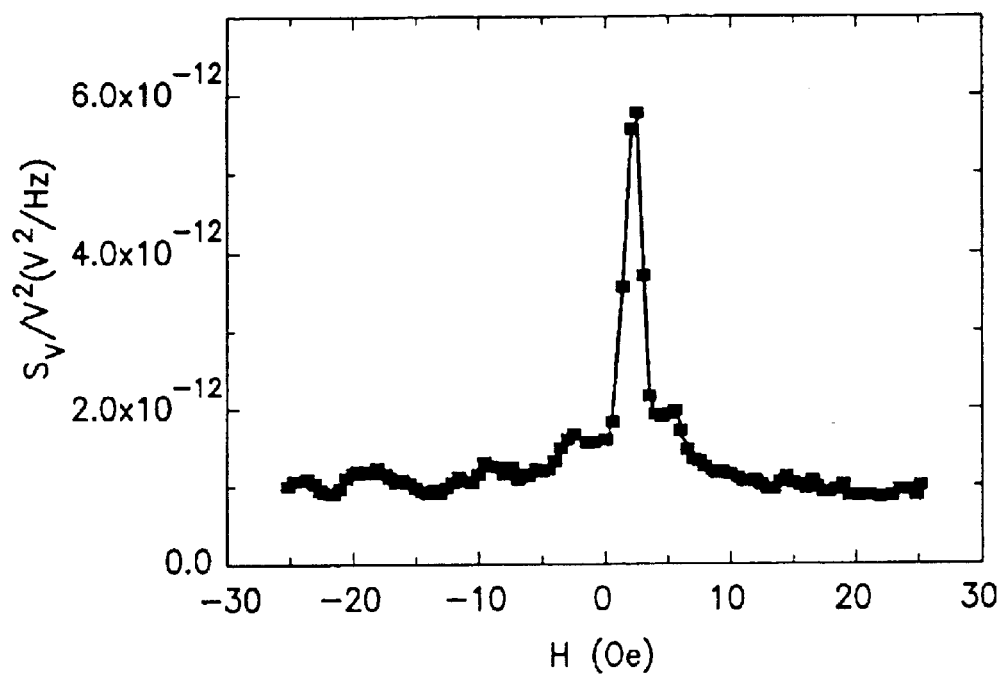
FIGS. 9A–9B, collectively referred to herein as FIG. 9, show the normalized noise spectra and the derivative of the R(H) without a biasing field. It shows that the noise and the field sensitivity [derivative of R(H)] is correlated. The noise value is obtained by extrapolating $S_V(f)$ to 1 Hz with field ramping down from anti-parallel to the parallel states of the two magnetization vectors.
Figure 9B:
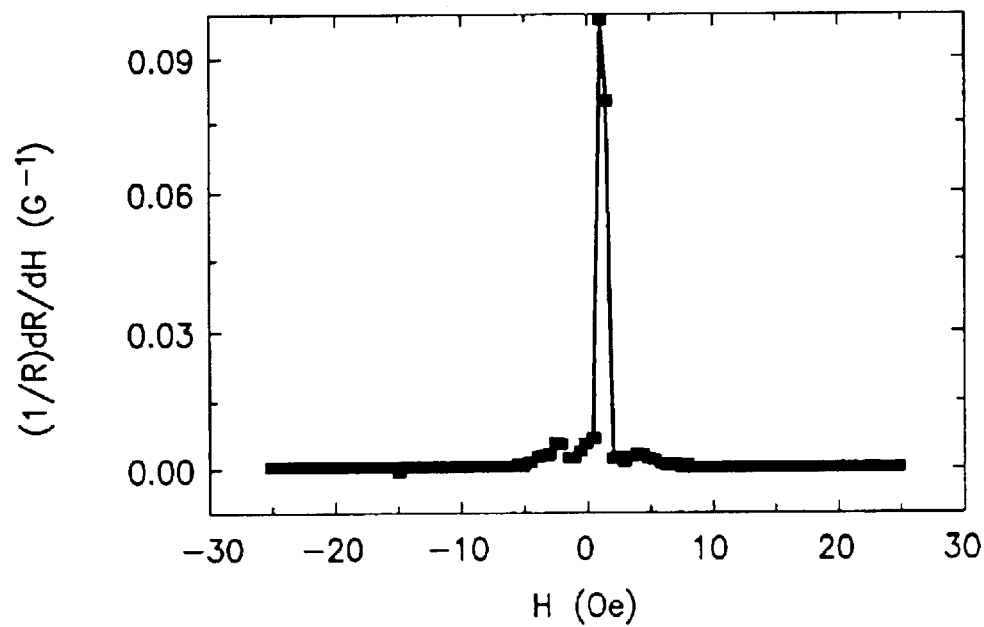

FIG. 8 shows the noise spectrum of a representative MTJ device under three different fields along the easy-axis. The three fields correspond to three unique magnetic states (antiparallel, near switching, and parallel state) in the MR curve, which is shown in the inset of FIG. 8. For this MTJ device, the MR value is about 30.8%, and the AP (antiparallel)→P (parallel) transition occurs at H=1.5 Oe. As shown in FIG. 8, above the knee frequency (~200 Oe), the device noise is dominated by thermal white noise and is never found to be deviate significantly from expected 4 k$_B$TR level. Below the knee frequency, the noise is of the type of 1/f noise, which can be quantified by Hooge's 1/f noise formula:

$$S_V = \frac{\alpha V^2}{A f^\gamma}, \tag{1}$$

where $\alpha$ is the material-specific Hooge parameter, A is junction area which is related the total number of two-level fluctuators that generate the 1/f noise, and $\gamma$ is the slope of the 1/f noise spectrum. In all the junctions measured, $\gamma$ is between 0.8–1.2. At H<−5 Oe, the junction is in the parallel (P) state, and the 1/f noise is relatively constant. At H>10 Oe, the junction is saturated in the antiparallel (AP) state, with relative larger noise level due to the increase in device resistance. The noise spectral density Sv at 1 Hz in the parallel state has been calculated to be 1.56×10$^{-14}$ V$^2$/Hz at H=−20 Oe, which is quieter by an order of magnitude than what Reed et al. determined in "Low frequency noise in magnetic tunneling junctions", *IEEE Transactions on Magnetics*, vol. 37, page 2028(2001). In FIG. 9A, the normalized noise Sv(f)/V$^2$ extrapolated to f=1 Hz is plotted as a function of the sweeping field. At the transition region (H=1.5 Oe), the magnitude of the 1/f noise increases by factor of six, giving a sharp peak around the switching field. For comparison, the derivative of magnetoresistance with respect to field is shown in FIG. 9B, the similarity between FIGS. 9A and B indicates the magnetic origin of MTJ noise, i.e., noise is due to fluctuations of magnetization in the free layer 7.

Figure 10A:
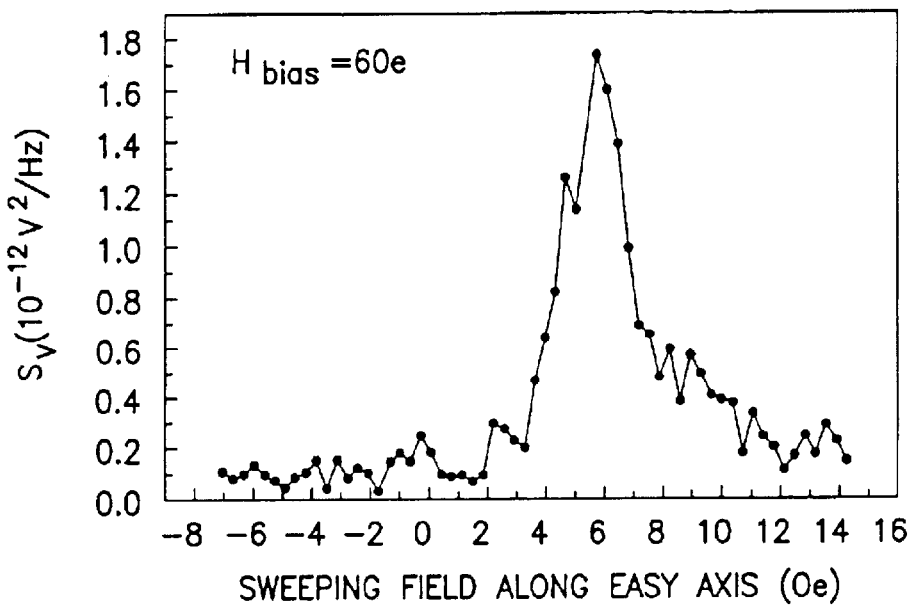
FIG. 10 Normalized noise spectrum versus easy axis sweeping fields (a), and the corresponding MR curve as well as its derivative with respective to easy axis field (sensitivity) (b) when hard bias field is 6 Oe.
Figure 10B:
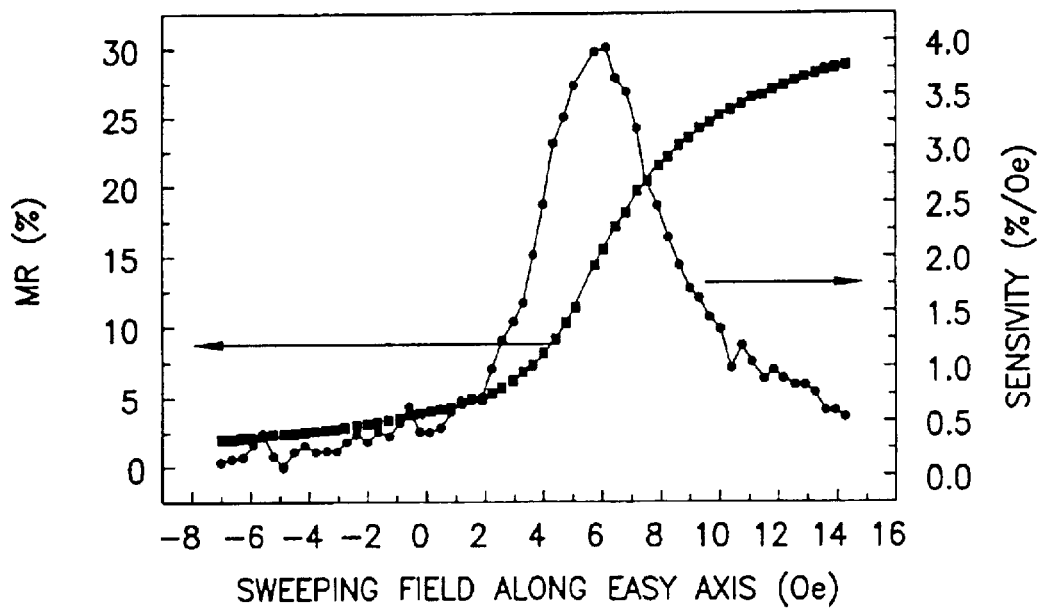

The noise behavior of the MTJ devices was also investigated in the sensor configuration. The noise spectrum was measured with hard-axis fields applied. As presented above, the MR curve is almost hysteresis-free and no Barkhausen noise is observed as long as the bias field is above the effective anisotropy field (3 Oe in this embodiment). Shown in FIG. 10 is the noise spectrum and MR as a function of H at bias field of 6 Oe for an MTJ sensor. An increase in noise level as sensitivity of the sensor reaches its maximum value (4%/Oe) is shown, with a broad peak as the easy axis field is swept through the AP-P transition region. The observed linear correlation between the noise and sensitivity data again implies that this noise is dominated by thermally activated magnetization fluctuations in the MTJ sensors fabricated by the invention herein. Derivation of the magnitude of magnetic field noise $S_H$ provides a relationship to the voltage noise $S_v$:

$$S_H = \left(\frac{\partial H}{\partial V}\right) S_V \approx \frac{1}{\frac{1}{R}\frac{\partial R}{\partial H}} \frac{S_V}{V^2}. \quad (2)$$

By this definition, a magnetic noise level of about 5 $nT/Hz^{1/2}$ is predicted, with a sensitivity of 4%/Oe with a hard-axis bias of 6 Oe.

A review of performance improvements resulting from the thermal annealing of the MTJ sensor is now provided.

Experimentation revealed that thermal annealing of the MTJ devices substantially improves the MTJ sensing performance. FIG. 11 shows the results of experimentation undertaken to assess the benefits of thermal annealing of the MTJ devices. In this embodiment, as-deposited MTJ devices were independently annealed at 100° C., 150° C., 170° C., 190° C., 220° C. and 240° C. for about 10 minutes in an external DC field of 1.6 kOe. Four properties, also referred to herein as performance parameters, of the annealed device were measured after each annealing step: resistance R; magnetoresistance MR; field sensitivity and noise. During the measurement, the device was field biased along the hard-axis with a field of 10 Oe, which is larger than the effective anisotropy field (3 Oe). Under this bias, the MR response is non-hysteretic and linear in field as in a sensor. The measurement results on the MTJ sensors are summarized in FIG. 11, with error bars corresponding to the standard deviation for 10 measured samples. FIG. 11 shows substantial benefits from thermal annealing on the performance of MTJ sensors in each of the properties examined, as described below.

In addition to demonstration of the benefits of thermal annealing, FIG. 11 provides a method for determining an annealing regimen for optimization of the MTJ devices. That is, completion of a series of annealing where conditions such as time and temperature are varied, and correlated to measurements of selected performance parameters will provide for determination of optimal post-pinning methods.

Figure 11A:
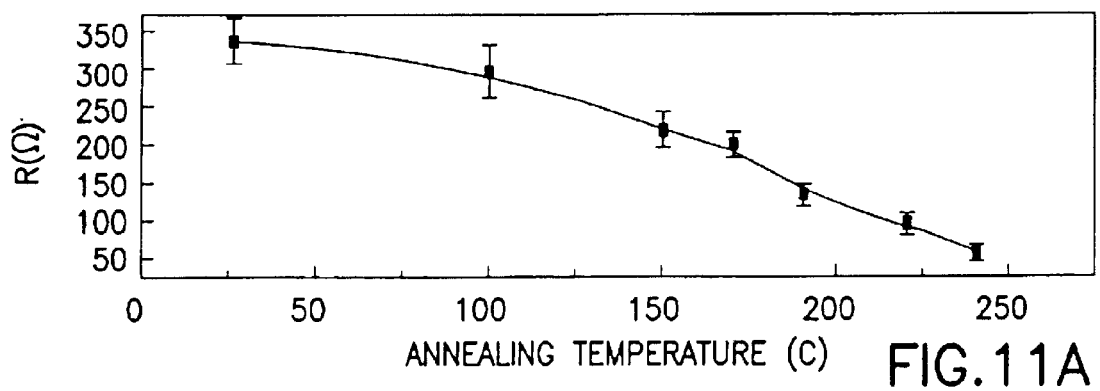
FIGS. 11A–D, collectively referred to herein as FIG. 11, shows thermal annealing temperature dependence of electrical resistance (A), magnetoresistance (B), sensitivity d(MR)/dH (C), and normalized noise spectrum $S_V/V^2$ (D) of an MTJ device, and identifies an annealing temperature that provides for optimized performance of the MTJ device. In this instance, optimal annealing temperature was found to be about 170° C.

FIG. 11A shows that in the preferred embodiment resistance decreases monotonically from about 350 Ω in the as-deposited sample to about 50 Ω in the sample annealed at 240° C. The decrease in resistance is beneficial to sensor applications, where the appropriate sensor resistance is typically of the order of 15–100 Ω. Use of thermal annealing offers another method to control the resistance, in addition to the usual methods of adjusting the barrier thickness or varying the junction area.

Figure 11B:
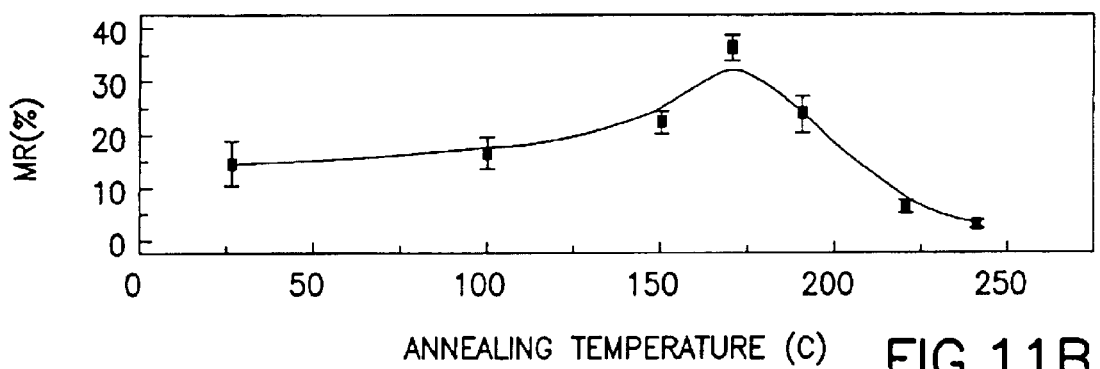
Figure 11C:
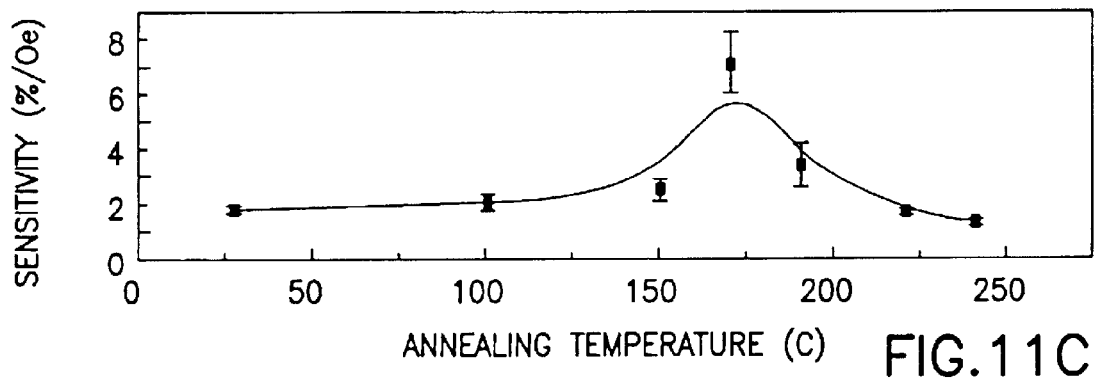

The second beneficial result of the thermal annealing is the marked improvement of the magnetoresistance of the MTJ sensor, as in shown in FIG. 11B. As shown in FIG. 11B, th eMR doubled from 15% to about 36% at the optimal annealing temperature of 170° C. Observations revealed that the MR decreased below and above 170° C., The third beneficial result of the thermal annealing is that the sensitivity of the MTJ sensor reaches a maximum value of 6%/Oe at 170° C., as shown in FIG. 11C.

Figure 11D:
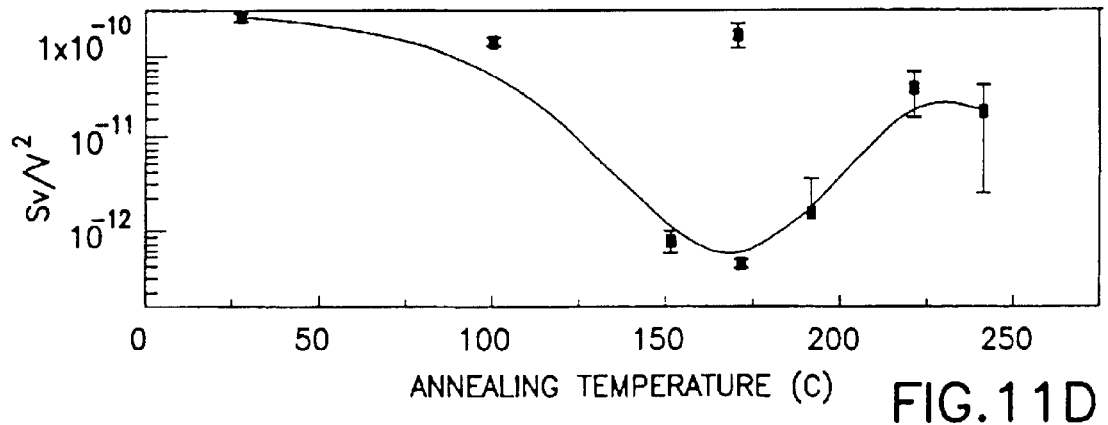

The fourth beneficial result of the thermal annealing is the substantial reduction of sensor noise. FIG. 11D shows a more than two orders of magnitude reduction in normalized noise, $Sv/V^2$, at the optimal annealing temperature of about 170° C. Above 170° C., noise increases again.

FIG. 11 show that the optimal annealing temperature for the representative MTJ sensors is 170° C. At this temperature, the values of the four important properties described in FIG. 11 can all be seen to be simultaneously optimized.

Figure 12:
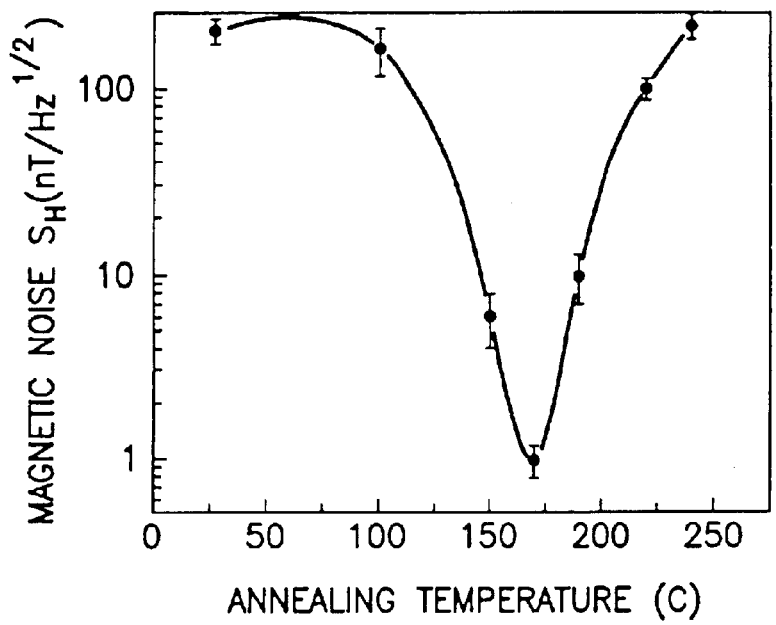
FIGS. 12A–C, collectively referred to herein as FIG. 12, show noise spectra versus sweeping field for three MTJ devices, (A) As-deposited, (B) annealed at 170° C., and (C) 220° C., respectively. Junction voltage as a function of field is also shown in the figures.

Using relation (2), the intrinsic magnetic noise, $S_H$, was calculated based on the voltage noise data shown in FIG. 11D. The value of $S_H$ as a function of annealing temperature is shown in FIG. 12. As presented in FIG. 12, the value of $S_H$ for the un-treated MTJ sensor is 200 $nT/Hz^{1/2}$. At the optimal annealing temperature of about 170° C., $S_H$ is reduced to about 1 $nT/Hz^{1/2}$. The magnetic noise figure is an important parameter for any magnetic sensor used to detect small fields, as a magnetic sensor can not detect external magnetic fields smaller than the intrinsic magnetic noise. The MTJ produced in accordance with these teachings may therefore operate with approximately a 200 times reduction in magnetic noise over existing sensors.

Figure 13A:
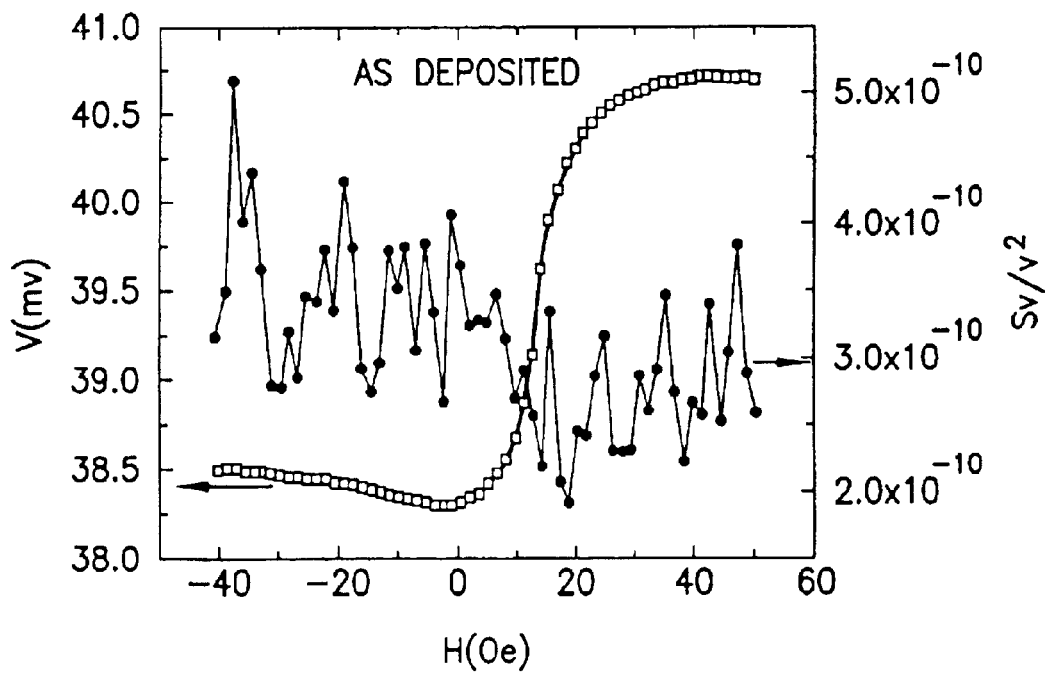
FIGS. 13A–C collectively referred to herein as FIG. 13, shows the material dependent parameter $\alpha=fS_VA/V^2$ and magnetic noise $S_h$ as the functions of annealing temperature. The material dependent parameter, $\alpha$, for the as-deposited MTJ device is shown in FIG. 13A, the material dependent parameter for optimized devices is shown in FIG. 13B, and the material dependent parameter for MTJ devices annealed at 220° C. is shown in FIG. 13C.
Figure 13B:
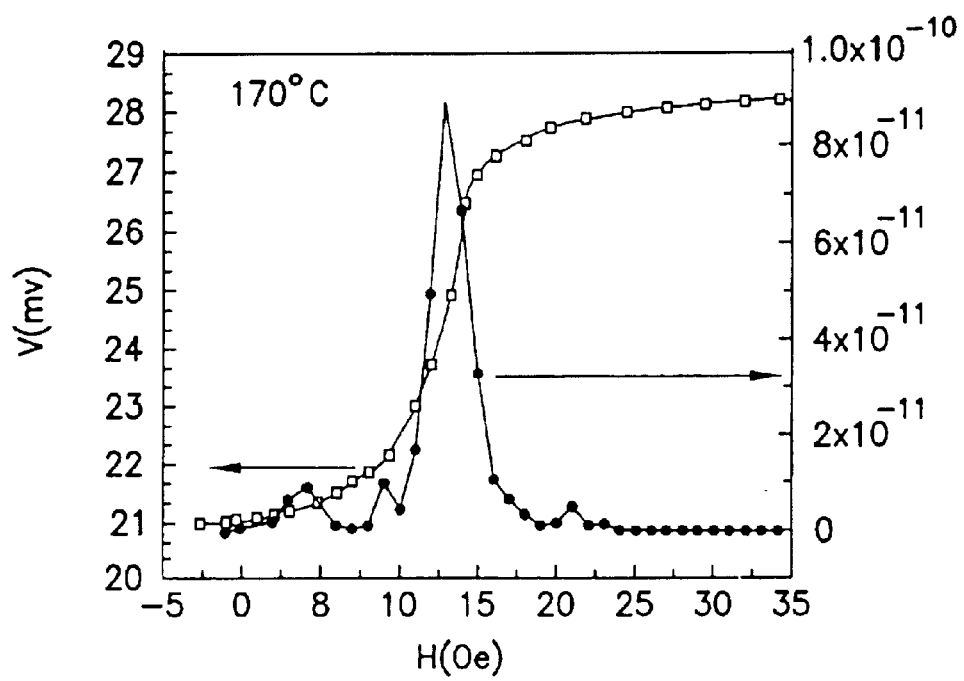
Figure 13C:
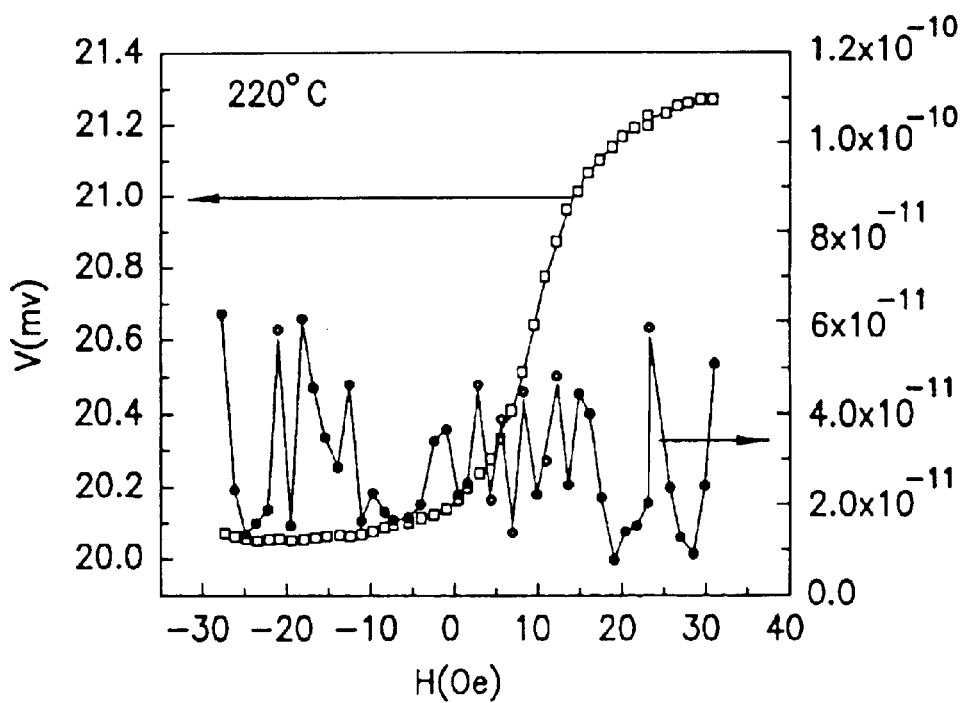

In addition to the above properties, the field dependence of noise for MTJ sensors annealed at different temperatures was measured. FIG. 13 shows representative results of the resistance and the voltage noise versus sweeping field along easy axis for three of the MTJ sensors, as-deposited (FIG. 13A), annealed at 170° C. (FIG. 13B), and at 220° C. (FIG. 13C), respectively. In the non-optimized MTJ sensors (as-deposited and annealed at 220° C.), the noise level does not depend on field to a large degree. However, for the optimized MTJ sensors (FIG. 13B), the noise level is at maximum in the most sensitive region of the sensor. Although the noise level reaches a peak in the most sensitive region of the sensor, the maximum noise in the optimized MTJ is still smaller than that in the non-optimized sensors.

Noise of MTJs can be of either electric or magnetic origin. For the as-deposited MTJ device, there exist defects outside and inside the tunnel barrier, which are among the sources of electrical noise. Magnetic noise is caused by magnetization fluctuations, particularly near domain walls and boundaries. Thermal annealing cures some of these defects, as demonstrated in the cross-sectional TEM images in FIG. 2B.

While described in the context of the sensors, the teachings of this invention are applicable to other applications where MTJ devices are of value. Such applications include, but are not limited to, use in magnetic random access memory. These teachings are not to be construed as limited to use of MTJ devices for sensor or magnetic random access memory applications.

Neither are these teachings to be construed as limiting to only the specific materials and thicknesses disclosed above, nor to the specific fabrication devices and processes disclosed above. Furthermore, more or less than four performance parameters may be optimized in the annealing procedure. Actual performance parameters selected for optimization may be dependent upon the application for the MTJ device.

What is claimed is:

1. A method for fabrication of a magnetic tunneling junction (MTJ) device, comprising:

depositing a multi-layered structure over a substrate, said multi-layered structure comprising a buffer layer, a seed layer, an antiferromagnetic layer, a pinned layer, a barrier layer, a free layer, and a passivation layer; and, annealing said multi-layered structure under conditions determined to simultaneously optimize a plurality of performance parameters of said MTJ device.

2. The method of claim 1, wherein said barrier layer is characterized by a substantially amorphous structure with little or no crystallinity.

3. The method of claim 1, wherein said antiferromagnetic layer is comprised of FeMn.

4. The method of claim 1, wherein said antiferromagnetic layer is comprised of PtMn.

5. The method of claim 1, wherein said antiferromagnetic layer is comprised of IrMn.

6. The method of claim 1, wherein said conditions are comprised of temperature and magnetic field.

7. The method of claim 1, wherein said step of depositing occurs at room temperature.

8. The method of claim 1, wherein said plurality of performance parameters comprise magnetoresistance.

9. The method of claim 1, wherein said plurality of performance parameters comprise electrical resistance.

10. The method of claim 1, wherein said plurality of performance parameters comprise magnetic field sensitivity.

11. The method of claim 1, wherein said plurality of performance parameters comprise magnetic noise.

12. The method of claim 1, wherein said buffer layer is comprised of Pt, the seed layer is comprised of $Ni_{81}Fe_{19}$, the antiferromagnetic layer is comprised of $Fe_{50}Mn_{50}$, the pinned layer is comprised of $Ni_{81}Fe_{19}$, the barrier layer is comprised of $Al_2O_3$, the free layer is comprised of $Ni_{81}Fe_{19}$.

13. The method of claim 12, wherein said buffer layer has a thickness of about 30 nm.

14. The method of claim 12, wherein said seed layer has a thickness of about 3 nm.

15. The method of claim 12, wherein said antiferromagnetic layer has a thickness of about 13 nm.

16. The method of claim 12, wherein said pinned layer has a thickness of about 6 nm.

17. The method of claim 12, wherein said barrier layer has a thickness of about 0.5 nm to about 2 nm, said barrier layer being characterized by a substantially amorphous structure with little or no crystallinity.

18. The method of claim 12, wherein said free layer has a thickness of about 12 nm.

19. The method of claim 12, wherein said annealing occurs at a temperature of between about 168° C. to about 170° C.

20. The method of claim 12, wherein said annealing occurs for about ten minutes.

21. The method of claim 12, wherein said annealing occurs in an external DC field of about 1.6 kOe.

22. The method of claim 1 wherein the performance parameters comprise at least two of magneto resistance, electrical resistance, sensitivity and magnetic noise.

23. The method of claim 1 wherein said annealing occurs at a temperature of between about 150° C. to about 200° C.

24. The method of claim 1, wherein the substrate defines a surface layer upon which the multi-layer structure is deposited, said surface layer characterized by a substantially amorphous structure with little or no crystallinity.

25. The method of claim 24, wherein the surface layer comprises $SiO_2$.

26. A method for fabrication of a magnetic tunneling junction (MTJ) device, comprising:
depositing a multi-layered structure over a substrate, said multi-layered structure comprising a buffer layer, a seed layer, an antiferromagnetic layer, a pinned layer, a barrier layer, a free layer, and a passivation layer; and,
processing said multi-layered structure to make magnetic noise of said multi-layer structure dependent upon a strength of a magnetic field applied to said multi-layer device, at least in a region of magnetic field strength wherein said structure is most sensitive.

27. The method of claim 26 wherein said processing comprises annealing.

28. The method of claim 27 wherein said annealing occurs at a temperature of between about 150° C. to about 200° C.

29. The method of claim 27 wherein said annealing occurs for about ten minutes.

30. The method of claim 26 wherein processing said multi-layered structure comprises processing such that a maximum magnetic noise occurs within the region of magnetic field strength wherein said structure is most sensitive.

31. In a magnetic tunneling junction (MTJ) device comprising a buffer layer, a seed layer, an antiferromagnetic layer, a pinned layer, a barrier layer, a free layer, and a passivation layer, a method for fabricating the barrier layer comprising:
depositing a barrier layer material at a thickness that is less than a final thickness;
oxidizing said barrier layer material in an environment containing sufficient oxygen such that said thickness is increased; and
reducing oxygen in said environment so that the thickness of the barrier layer material is not further increased.

32. The method of claim 31 wherein said environment containing sufficient oxygen is within a vacuum chamber at a pressure that is less than atmospheric pressure.

33. The method of claim 32 wherein said pressure within the vacuum chamber is about 120 mTorr.

34. The method of claim 31 wherein reducing oxygen in said environment comprises immobilizing oxygen gas within said vacuum chamber.

35. The method of claim 34 wherein immobilizing oxygen gas comprises absorbing oxygen gas.

* * * * *